(12) United States Patent
Wangsness et al.

(10) Patent No.: US 7,885,632 B2
(45) Date of Patent: Feb. 8, 2011

(54) AUTOMATED NOISE MEASUREMENT SYSTEM

(75) Inventors: Todd Wangsness, Irvine, CA (US); Eugene Rzyski, Fallbrook, CA (US)

(73) Assignee: OmniPhase Research Laboratories, Inc., Newport Beach, CA (US)

( * ) Notice: Subject to any disclaimer, the term of this patent is extended or adjusted under 35 U.S.C. 154(b) by 584 days.

(21) Appl. No.: 12/016,188

(22) Filed: Jan. 17, 2008

(65) Prior Publication Data

US 2008/0214129 A1 Sep. 4, 2008

Related U.S. Application Data

(63) Continuation-in-part of application No. 11/134,546, filed on May 20, 2005, and a continuation-in-part of application No. 11/494,884, filed on Jul. 28, 2006, now Pat. No. 7,693,674.

(60) Provisional application No. 60/885,218, filed on Jan. 17, 2007.

(51) Int. Cl.
*H04B 1/30* (2006.01)
*G06F 19/00* (2006.01)

(52) U.S. Cl. .................................. 455/324; 455/258
(58) Field of Classification Search .............. 455/255, 455/256, 257, 258, 115.1, 323, 324, 326
See application file for complete search history.

(56) References Cited

U.S. PATENT DOCUMENTS

| 5,179,344 | A | * | 1/1993 | Najle et al. | 324/613 |
| 5,337,014 | A | * | 8/1994 | Najle et al. | 324/613 |
| 5,608,331 | A | * | 3/1997 | Newberg et al. | 324/613 |
| 6,057,690 | A | * | 5/2000 | Buckley | 324/613 |
| 6,393,372 | B1 | * | 5/2002 | Rzyski | 702/111 |
| 6,745,020 | B2 | * | 6/2004 | Rzyski et al. | 455/323 |
| 6,793,372 | B2 | * | 9/2004 | Wehner et al. | 362/247 |
| 7,302,237 | B2 | * | 11/2007 | Jackson et al. | 455/76 |

* cited by examiner

*Primary Examiner*—Blane J Jackson
(74) *Attorney, Agent, or Firm*—The Eclipse Group LLP

(57) ABSTRACT

A noise test measurement system configured to measure a noise component of a transmitted RF signal is described. The noise test measurement system may include an antenna, a low-noise amplifier, a local oscillator, a first coupler, a first variable phase-shifter, a first mixer, and a processor.

12 Claims, 11 Drawing Sheets

US 7,885,632 B2

AUTOMATED NOISE MEASUREMENT SYSTEM

CROSS-REFERENCE TO RELATED APPLICATIONS

This application is a Continuation-In-Part ("CIP") of U.S. patent application Ser. No. 11/134,546, titled "Intelligent Low Noise Design," filed May 20, 2005. This application is also a CIP of U.S. patent application Ser. No. 11/494,884, titled "Low-Noise Source," filed Jul. 28, 2006, now U.S. Pat. No. 7,693,674 which is itself a CIP of U.S. patent application Ser. No. 11/134,546, both of which are hereby incorporated by reference in their entirety. This application also claims priority to U.S. Provisional Patent Application No. 60/885,218, titled "Wireless Noise Measurement," filed on Jan. 17, 2007, which application is hereby incorporated by reference in its entirety.

BACKGROUND OF THE INVENTION

1. Field of Invention

This invention relates to noise measurements and more particularly to an automated noise measurement system for wireless transmitters.

2. Related Art

In general, the purpose of an electrical, electro-optic, and electro-acoustic communication system is to transmit information-bearing signals (generally known as "baseband signals") through a communication channel separating a transmitter from a receiver. The term baseband signal (also known as baseband wave, baseband waveform, or just a "baseband") is used to designate the band of frequencies representing the original information-carrying signal as delivered by a source of information.

The efficient utilization of the communication channel typically requires a shift of the range of baseband signal's frequencies into other frequency ranges suitable for transmission through the communication channel, and then a corresponding shift back to the original frequency range after reception. As an example, a typical radio system generally must operate with signals having frequencies of 30 kHz and above, whereas the baseband signal usually contains frequencies in the audio frequency range (i.e., 20 to 20 kHz frequency range), and so some form of frequency-band shifting must be used for the radio system to operate satisfactorily. A shift of the range of frequencies in a signal may be accomplished by using the process of "modulation" that is defined as the process of varying some characteristic of a carrier signal (also known as a carrier wave, carrier waveform, or just a "carrier") in accordance with a modulating signal (also known as a modulating wave or modulating waveform). The carrier signal is typically a signal having a continuous waveform (which is usually electrical) whose properties are capable of being modulated, or impressed, with a second signal that is an information-carrying signal (i.e., the modulating signal). Generally, the carrier signal itself conveys no information until altered in some fashion, such as having its amplitude changed, its frequency changed, or its phase changed by the modulating signal. These modulating signal induced changes convey information via the resulting signal from the modulation process. In this situation, the baseband signal is referred to as the modulating signal, and the result of the modulation process is referred to as a modulated signal (or modulated wave). At the receiving end of the communication system, it is usually required that the modulating signal (i.e., the original baseband signal that is also the original information-carrying signal) be restored so as to receive the information carried on the modulating signal. This is accomplished by using a process known as demodulation, which is the reverse of the modulation process.

Unfortunately, noise in electrical, electro-optic, and electro-acoustic systems may disrupt both the amplitude and/or phase of signals that are utilized and/or processed by these types of systems. In this situation, the term "noise" is used to designate unwanted signals that tend to disturb the transmission and processing of the desired signals in electrical, electro-optic, and electro-acoustic systems. However, because many of these types of systems are relatively insensitive to fluctuations in amplitude, the fluctuations in phase (denoted as "phase-noise") are generally more problematic. As an example, an oscillator is a device capable of producing an oscillating output signal (such as, for example, a signal having a sinusoidal waveform generally known as a "sinusoid signal") having an oscillating frequency. Generally, an oscillator includes some type of amplitude-limiting feature that reduces the effects of any potential fluctuations in amplitude such that phase-noise is typically the major noise contributor to the resulting oscillator output signal.

Because noise, such as phase-noise, is such an important factor in the design and/or performance of electrical, electro-optic, and/or electro-acoustic systems, designers typically desire a measure of the phase-noise for a given system. In the past, various approaches have been utilized to characterize the phase-noise of a given system. For example, amplifiers have been characterized by first injecting an input signal of a known frequency into an input of an amplifier and then measuring the resulting amplified output signal with a spectrum analyzer where the spectrum analyzer is a device capable of displaying the spectral waveform composition of some electrical, acoustic, or optical signals including the respective amplitude intensity and frequency of a given signal. Unfortunately, the measurement sensitivity of this approach is limited by the relatively poor sensitivity of the spectrum analyzer. Moreover, it is difficult to measure the phase-noise at frequencies values that are close to the carrier frequency of the signal, where the carrier frequency is the frequency of the carrier signal.

Unlike a spectrum analyzer, a phase-locked discriminator system has relatively good sensitivity and generally allows measurements close to the carrier frequency. However, configuring a phase-locked discriminator system is cumbersome and time consuming. In attempt to solve this problem, an Automated Phase-locked Discriminator Noise-test Measurement System ("APD System") was developed as described in U.S. Pat. No. 6,793,372 (which is herein incorporated by reference in its entirety) that attempts to alleviate the cumbersome nature of such systems. In FIG. 1, a functional block diagram is shown of an example of an implementation of an APD System 100 in signal communication with a unit-under-test ("UUT") 102 and spectrum analyzer 104 via signal paths 106, 108, and 110, respectively.

The APD System 100 includes a variable low-noise source 112, variable phase-shifter 114, variable amplifier 116, mixer 118, variable low-noise matching amplifier 120, analog-to-digital converter ("ADC") 122, and controller 124. The UUT 102 is in signal communication with both the variable low-noise source 112 and variable amplifier 116 via signal paths 106 and 108, respectively. The mixer 118 is in signal communication with the variable phase-shifter 114, variable amplifier 116, and variable low-noise matching amplifier 120 via signal paths 126, 128, and 130, respectively. The variable phase-shifter 114 is also in signal communication with the variable low-noise source 112 via signal path 132. The ADC 122 is in signal communication with both the variable low-noise matching amplifier 120 and controller 124 via signal paths 134 and 136, respectively. The controller 124 is in signal communication with the spectrum analyzer 104, variable low-noise source 112, variable phase-shifter 114, variable amplifier 116, and variable low-noise matching amplifier 120 via signal paths 110, 138, 140, 142, and 144, respectively.

As an example of operation, the variable low-noise source 112 produces a UUT input signal 146 (which is low-noise carrier signal) for driving the UUT 102. The UUT 102 may be any device for which a user desires a phase-noise test measurement such as, for example, an amplifier, phase-shifter, diplexer or other suitable device or system of devices. The UUT 102 receives the UUT input signal 146, via signal path 106, and processes it to produce a UUT output signal 148. As an example, if UUT 102 is an amplifier, the UUT output signal 148 would be an amplified version of the UUT input signal 146. The UUT output signal 148 is received, via signal path 108, and amplified by the variable amplifier 116 to produce a variable amplifier signal 150 that is passed to mixer 118 via signal path 128. The variable low-noise source 112 also produces a variable phase-shifter input signal 152 that is passed to the variable phase-shifter 114 via signal path 132. The variable phase-shifter input signal 152 is identical to the UUT input signal 146 and has the same frequency as the UUT input signal 146. The variable phase-shifter 114 phase shifts the variable phase-shifter input signal 152 by 90 degrees to produce a variable phase-shifted signal 154 that is passed to the mixer 118 via signal path 126. In this fashion, the carrier signal of the variable amplifier signal 150 is eliminated from a mixer output signal 156 produced by the mixer 118. To keep the mixer output signal 156 in the proper dynamic range of the ADC 122, the mixer output signal 156 is passed, via signal path 130, to and processed by the variable low-noise matching amplifier 120 to produce a variable low-noise matched output signal 158 that is passed to the ADC 122 via signal path 134.

To eliminate the carrier signal of the variable amplifier signal 150, the variable phase-shifted signal 154 must be in quadrature (i.e., shifted 90 degrees) with respect to the carrier signal. If a quadrature relationship between the variable amplifier signal 150 and variable phase-shifted signal 154 is not established, a DC offset will be present in a digital ADC output signal 160 from the ADC 122.

The controller 124 monitors the ADC output signal 160 and controls the variable phase-shifter 114 using a variable phase-shifter control signal 162 to maintain the quadrature relationship between the variable amplifier signal 150 and variable phase-shifted signal 154. The variable phase-shifter control signal 162 is sent to the variable phase-shifter 114 via signal path 140.

The elimination of the carrier signal from the variable amplifier signal 150 also depends upon whether the carrier signal (i.e., UUT input signal 146) and the phase-shifted version of the carrier (i.e., variable phase-shifted signal 154) are of equal power when entering the mixer 118. Thus, analogous to the control of the variable phase-shifter 114, the controller 124 also controls the variable amplifier 116 responsive to processing the ADC output signal 160 using a variable amplifier control signal 164, via signal path 142, to maintain equal powers for the variable phase-shifted signal 154 and variable amplifier signal 150. These powers need not be maintained exactly equal but instead may merely be within a sufficient range of each other so that linear operation of the mixer 118 is assured. Those of ordinary skill in the art will appreciate that variable amplifier 116 does not just amplify but may also attenuate responsive to the variable amplifier control signal 164. As an example, if the UUT 102 is an amplifier, the variable amplifier 116 may have to attenuate the UUT output signal 148 to keep both the variable phase-shifted signal 154 and variable amplifier signal 150 in comparative power equality. The controller 124 may also control the variable low-noise matching amplifier 120 utilizing a variable low-noise matched amplifier control signal 166, via signal path 144, to maintain the variable low-noise matched output signal 158 in a proper dynamic range for the ADC 122.

Having controlled the components for quadrature operation, the controller 124 eliminates the carrier signal from the ADC output signal 160 such that the ADC output signal 160 simply represents the phase-noise. The phase-noise injected by the variable low-noise source 112 may be accounted for by a calibrating operation such that the UUT 102 is removed and the variable low-noise source 112 simply feeds the variable amplifier 116 directly, although such a direct feed may occur through a delay line (not shown). The resulting phase-noise in the ADC output signal 160 during calibration may be stored in a memory (not shown) associated with controller 124. Thus, during testing of the UUT 102, the controller 124 (or the spectrum analyzer 104 associated with the controller 124) may perform a Fourier analysis of the ADC output signal 160 to determine the phase-noise power. The measured phase-noise may then be adjusted by the phase-noise injected by the variable low-noise source 112 to determine the additive phase-noise supplied by the UUT 102.

The phase-noise measured in the ADC output signal 160 depends upon the frequency of the UUT input signal 146. For example, the UUT 102 may be quite noisy at one frequency but less so at another. To measure phase-noise across a range of frequencies, the controller 124 may command the variable low-noise source 112 to change the frequency of the UUT input signal 146 utilizing a variable low-noise source command signal 168, via signal path 138, measure the resulting phase-noise, change the frequency again, measure the resulting phase-noise after the change of frequency, and so on. Advantageously, such measurement is performed automatically and accurately with no manual intervention or tailing as would be necessary in conventional phase-noise test measurement systems.

Unfortunately, although the APD System 100 represents a significant advance in the art, certain challenges still remain because many factors are involved in properly biasing or driving a given component for optimum low-noise performance. As an example, if the UUT 102 is a fiber-optic link, the APD System 100 will not be able to test the fiber-optic link without extensive manual involvement from a user because the fiber-optic link will typically require manual biasing for optimal performance so that it may be properly tested by the APD System 100.

As an example, in FIG. 2 a functional block diagram of a conventional fiber-optic link 200 is shown. The fiber-optic link 200 may include an input amplifier 202, laser diode 204, fiber-optic channel 206, photo-detector 208, and output amplifier 210. In this example, the laser diode 204 may be in signal communication with the input amplifier 202 and fiber-optic channel 206 via signal paths 212 and 214, respectively. The photo detector 208 may be in signal communication with the fiber-optic channel 206 and output amplifier 210 via signal paths 216 and 218, respectively.

In an example of operation, the input amplifier 202 amplifies an electrical input signal $s_{in}(t)$ 220 and produces a laser input signal 222 to drive the laser diode 204. In turn, the laser diode 204 drives an input optical signal 224 into the fiber-optic channel 206 (that may be an optical fiber). After passing through fiber-optic channel 206, the output optical signal 226 is converted into an electrical signal 228 in the photo-detector 208. The output amplifier 210 then amplifies the electrical signal 228 to provide an output signal $s_{out}(t)$ 230. Unfortunately, many factors are involved in properly biasing the fiber-optic link 200 for optimal performance with an APD System. For example, matching input and output amplifiers 202 and 210 to the fiber-optic link 200 that includes properly biasing the transistors within input and output amplifiers 202 and 210 and properly biasing the laser diode 204 and photo-detector 208 are all factors that affect the additive phase-noise that the fiber-optic link 200 injects into the output signal $s_{out}(t)$ 230. However, a designer of the fiber-optic link 200 has no intelligent way of setting these factors. A similar situation exists for the proper setting of variables in many other systems and devices.

Additionally, although the APD System 100 may be advantageously used to characterize the phase-noise performance of many different types of UUTs 102, the APD System 100, unfortunately, requires a non-wireless signal path to the variable low-noise source 112 such as, for example, a transmission line that may include a coaxial cable or a coplanar waveguide to carry the source signal. There are transmitters such as those utilized in cellular telephones in which it is very inconvenient or impossible to access the source signal through such a signal path.

Accordingly, there is a need in the art for automated systems that are capable of measuring the phase-noise performance of wireless transmitters through reception and analysis of a transmitted wireless signal.

SUMMARY

A noise test measurement system configured to measure a noise component of a transmitted RF signal is disclosed. The noise-test measurement system may include an antenna, low-noise amplifier, frequency source (which may be a local oscillator), first coupler, first variable phase-shifter, first mixer, and controller (which may be processor). The antenna may be configured for receiving the transmitted RF signal to provide a received RF signal and the low-noise amplifier may be configured to amplify the received RF signal to provide an amplified RF signal. The frequency source may be configured to provide a frequency reference signal (which may be an LO signal). The first coupler may be configured to combine a first version of the LO signal with the amplified RF signal to provide a combined RF signal and the first variable phase-shifter may be configured to phase-shift a second version of the LO signal into a quadrature LO signal responsive to a control signal. The first mixer may have an RF port configured to receive the combined RF signal and an LO port configured to receive the quadrature LO signal. The first mixer may further be configured to mix the signals received at its RF and LO ports to provide a first mixed output signal. The controller may be configured to analyze a digitized version of the first mixed output signal so as to produce the control signal and to measure the noise component.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The invention can be better understood with reference to the following figures. The components in the figures are not necessarily to scale, emphasis instead being placed upon illustrating the principles of the invention. In the figures, like reference numerals designate corresponding parts throughout the different views.

DETAILED DESCRIPTION

In the following description of the preferred embodiment, reference is made to the accompanying drawings that form a part hereof, and in which is shown by way of illustration a specific embodiment in which the invention may be practiced. It is to be understood that other embodiments may be utilized and structural changes may be made without departing from the scope of this invention.

Unit-Under-Test Having at Least One Controllable Variable

Figure 3:
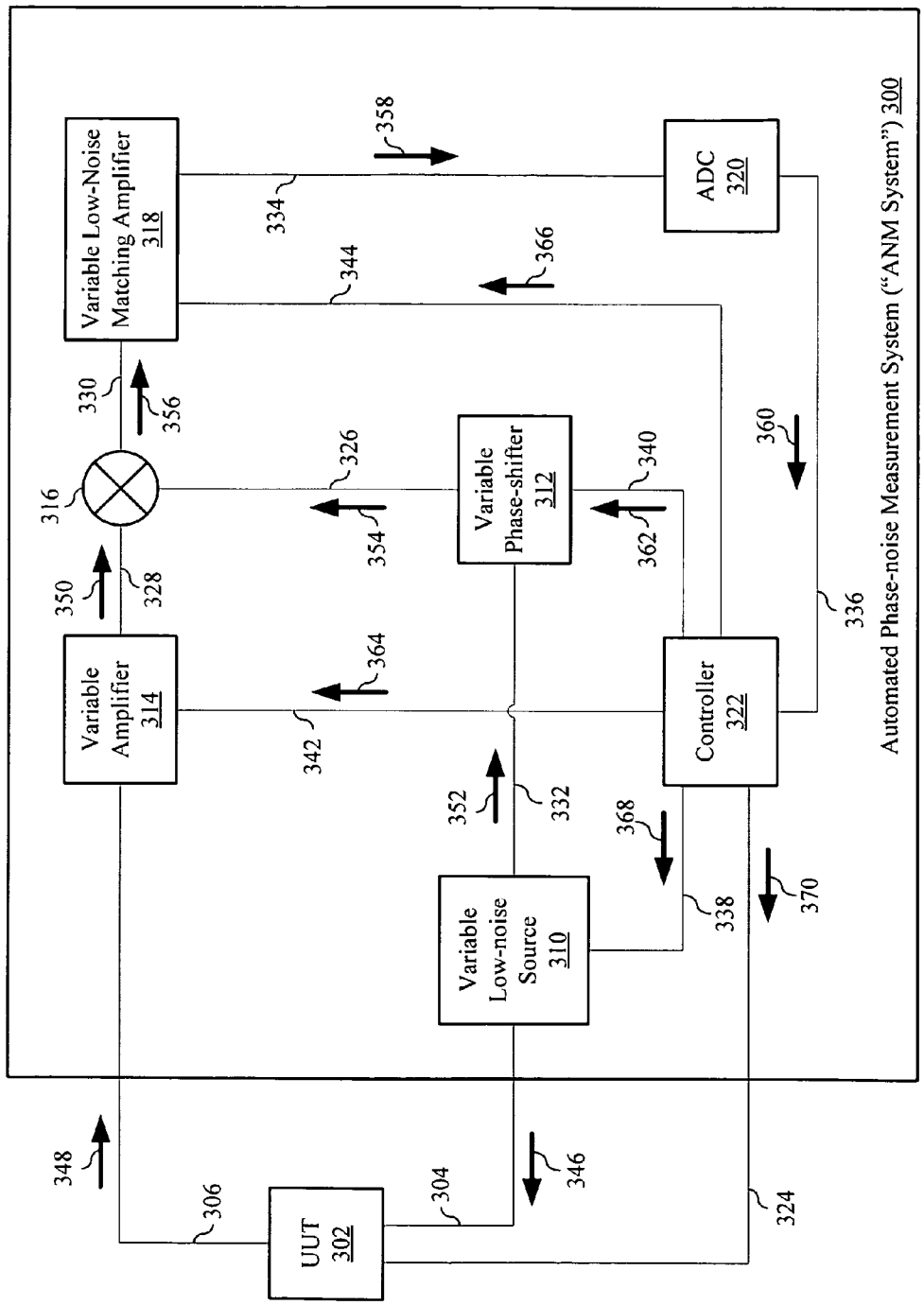
FIG. 3 shows a functional block diagram of an example of an implementation of an automated phase-noise measurement system ("ANM System") in accordance with the invention.

In FIG. 3, a functional block diagram is shown of an example of an implementation of an automated phase-noise measurement system ("ANM System") 300 in accordance with the invention. The ANM System 300 utilizes feedback to tune one or more controllable variables in a unit-under-test ("UUT") 302 responsive to phase-noise measurements so as to minimize the additive phase-noise provided by the UUT 302. The UUT 302 is in signal communication with the ANM System 300 via signal paths 304, 306, and 324, respectively.

The ANM System 300 may include a variable low-noise source 310, variable phase-shifter 312, variable amplifier 314, mixer 316, variable low-noise matching amplifier 318, analog-to-digital ("ADC") 320, and controller 322. In this example, the UUT 302 may be in signal communication with the variable low-noise source 310, variable amplifier 314, and controller 322 via signal paths 304, 306, and 324, respectively. The mixer 316 may be in signal communication with the variable phase-shifter 312, variable amplifier 314, and variable low-noise matching amplifier 318 via signal paths 326, 328, and 330, respectively. The variable phase-shifter 312 is also in signal communication with the variable low-noise source 310 via signal path 332. The ADC 320 is in signal communication with both the variable low-noise matching amplifier 318 and controller 322 via signal paths 334 and 336, respectively. The controller 322 is in signal communication with the UUT 302, variable low-noise source 310, variable phase-shifter 312, variable amplifier 314, and variable low-noise matching amplifier 318, via signal paths 324, 338, 340, 342, and 344, respectively. The controller 322 may be a controller device, microcontroller, processor, microprocessor, application specific integrated circuit ("ASIC"), digital signal processor ("DSP"), or other similar programmable device.

It is appreciated by those skilled in the art that the term "in signal communication" means any communication and/or electromagnetic, acoustic, digital, or information-carrying connection and/or coupling along any signal path between two devices that allows signals (including both non-information and information-carrying signals) and/or information to pass from one device to another and includes wireless, wired, analog, and/or digital signal paths. The "signal paths" may be physical such as, for example, conductive wires, electromagnetic transmission lines and/or waveguides, attached and/or electromagnetic or mechanically coupled terminals, semiconductive or dielectric materials or devices, or other similar physical connections or couplings. Additionally, the signal paths may be non-physical such as free-space (in the case of electromagnetic propagation) or information-carrying paths through digital components where communication information is passed from one device to another in varying digital formats without necessarily passing through a direct electromagnetic connection.

The UUT 302 may be any device that a user desires a phase-noise test measurement such as, for example, an amplifier, phase-shifter, diplexer, fiber-optic link, or other suitable device or system of devices. Unlike the UUT shown in FIG. 1, the UUT 302 in this example of an implementation possesses at least one controllable variable that affects the phase-noise that the UUT 302 injects into its output signal.

As an example of operation, the variable low-noise source 310 produces a UUT input signal 346 (which may be a low-noise carrier signal) for driving the UUT 302. The UUT 302 may be any device for which a user desires a phase-noise test measurement such as, for example, an amplifier, phase-shifter, diplexer, fiber-optic link, or other suitable device or system of devices. The UUT 302 receives the UUT input signal 346, via signal path 304, and processes it to produce a UUT output signal 348. As an example, if the UUT 302 is an amplifier, the UUT output signal 348 would be an amplified version of the UUT input signal 346. The UUT output signal 348 is received, via signal path 306, and amplified by the variable amplifier 314 to produce a variable amplifier signal 350 that is passed to mixer 316 via signal path 328. The variable low-noise source 310 also produces a variable phase-shifter input signal 352 that is passed to the variable phase-shifter 312 via signal path 332. The variable phase-shifter input signal 352 is identical to the UUT input signal 346 and has the same frequency as the UUT input signal 346. The variable phase-shifter 312 phase shifts the variable phase-shifter input signal 352 by 90 degrees to produce a variable phase-shifted signal 354 that is passed to the mixer 316 via signal path 326. In this fashion, the carrier signal of the variable amplifier signal 350 is eliminated from a mixer output signal 356 produced by the mixer 316. To keep the mixer output signal 356 in the proper dynamic range of the ADC 320, the mixer output signal 356 is passed, via signal path 330, to and processed by the variable low-noise matching amplifier 318 to produce a variable low-noise matched output signal 358 that is passed to the ADC 320 via signal path 334.

To eliminate the carrier signal of the variable amplifier signal 350, the variable phase-shifted signal 354 must be in quadrature (i.e., shifted 90 degrees) with respect to the carrier signal. If a quadrature relationship between the variable amplifier signal 350 and variable phase-shifted signal 354 is not established, a DC offset will be present in a digital ADC output signal 360 from the ADC 320.

Figure 1:
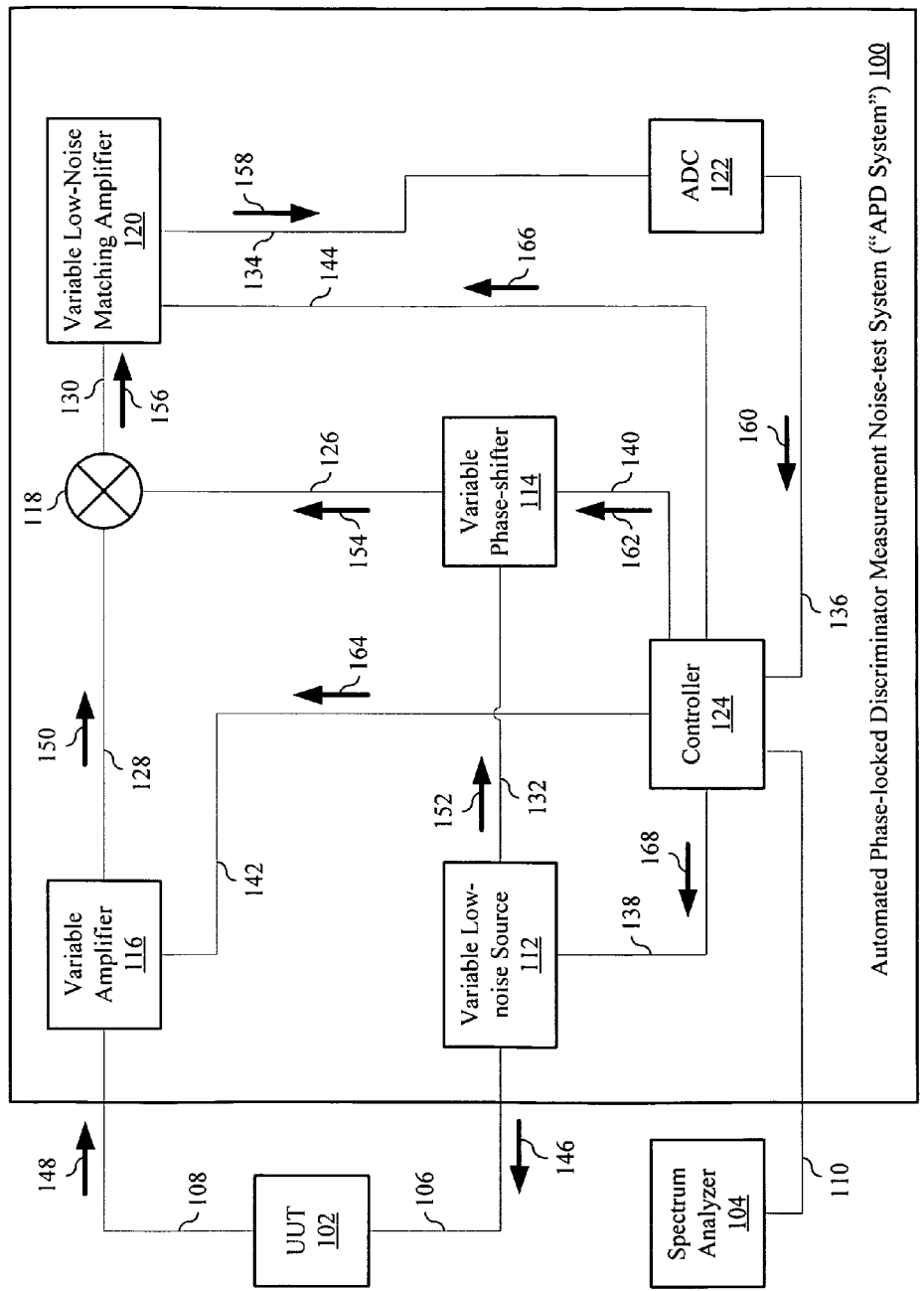
FIG. 1 shows a functional block diagram of an example of an implementation of a known automated phase-locked discriminator measurement noise-test system ("APD System") in signal communication with a unit-under-test ("UUT") and spectrum analyzer.

Similar to the APD System shown in FIG. 1, the controller 322 monitors the ADC output signal 360 and controls the variable phase-shifter 312 using a variable phase-shifter control signal 362 to maintain the quadrature relationship between the variable amplifier signal 350 and variable phase-shifted signal 354. The variable phase-shifter control signal 362 is sent to the variable phase-shifter 312 via signal path 340.

The elimination of the carrier signal from the variable amplifier signal 350 also depends upon whether the carrier signal (i.e., UUT input signal 346) and the phase-shifted version of the carrier (i.e., variable phase-shifted signal 354) are of equal power when entering the mixer 316. Thus, analogous to the control of the variable phase-shifter 312, the controller 322 also controls the variable amplifier 314 responsive to processing the ADC output signal 360 using a variable amplifier control signal 364, via signal path 342, to maintain equal powers for the variable phase-shifted signal 354 and variable amplifier signal 350. These powers need not be maintained exactly equal but instead may merely be within a sufficient range of each other so that linear operation of the mixer 316 is assured. Again, those of ordinary skill in the art will appreciate that variable amplifier 314 does not just amplify but may also attenuate responsive to the variable amplifier control signal 364. As an example, if the UUT 302 is an amplifier, the variable amplifier 314 may have to attenuate the UUT output signal 348 to keep both the variable phase-shifted signal 354 and variable amplifier signal 350 in comparative power equality. The controller 322 may also control the variable low-noise matching amplifier 318 utilizing a variable low-noise matching amplifier control signal 366, via signal path 344, to maintain the variable low-noise matched output signal 358 in a proper dynamic range for the ADC 320.

Having controlled the components for quadrature operation, the controller 322 eliminates the carrier signal from the ADC output signal 360 such that the ADC output signal 360 simply represents the phase-noise. The phase-noise injected by the variable low-noise source 310 may be accounted for by a calibrating operation such that the UUT 302 is removed and the variable low-noise source 310 simply feeds the variable amplifier 314 directly, although such a direct feed may occur through a delay line (not shown). The resulting phase-noise in the ADC output signal 360 during calibration may be stored in a memory (not shown) associated with controller 322. Thus, during testing of the UUT 302, the controller 322 may perform a Fourier analysis of the ADC output signal 360 to determine the phase-noise power. The measured phase-noise may then be adjusted by the phase-noise injected by the variable low-noise source 310 to determine the additive phase-noise supplied by the UUT 302.

The phase-noise measured in the ADC output signal 360 depends upon the frequency of the UUT input signal 346. For example, the UUT 302 may be quite noisy at one frequency but less so at another. To measure phase-noise across a range of frequencies, the controller 322 may command the variable low-noise source 310 to change the frequency of the UUT input signal 346 utilizing a variable low-noise source command signal 368, via signal path 338, measure the resulting phase-noise, change the frequency again, measure the resulting phase-noise after the change of frequency, and so on.

In the situation where the UUT 302 is a device that possesses at least one controllable variable that affects the phase-noise that the UUT 302 injects into its output signal, the controller 322 controls the values of the at least one controllable variable utilizing a UUT command signal 370 that is sent to the UUT 302 via signal path 324.

Figure 4:
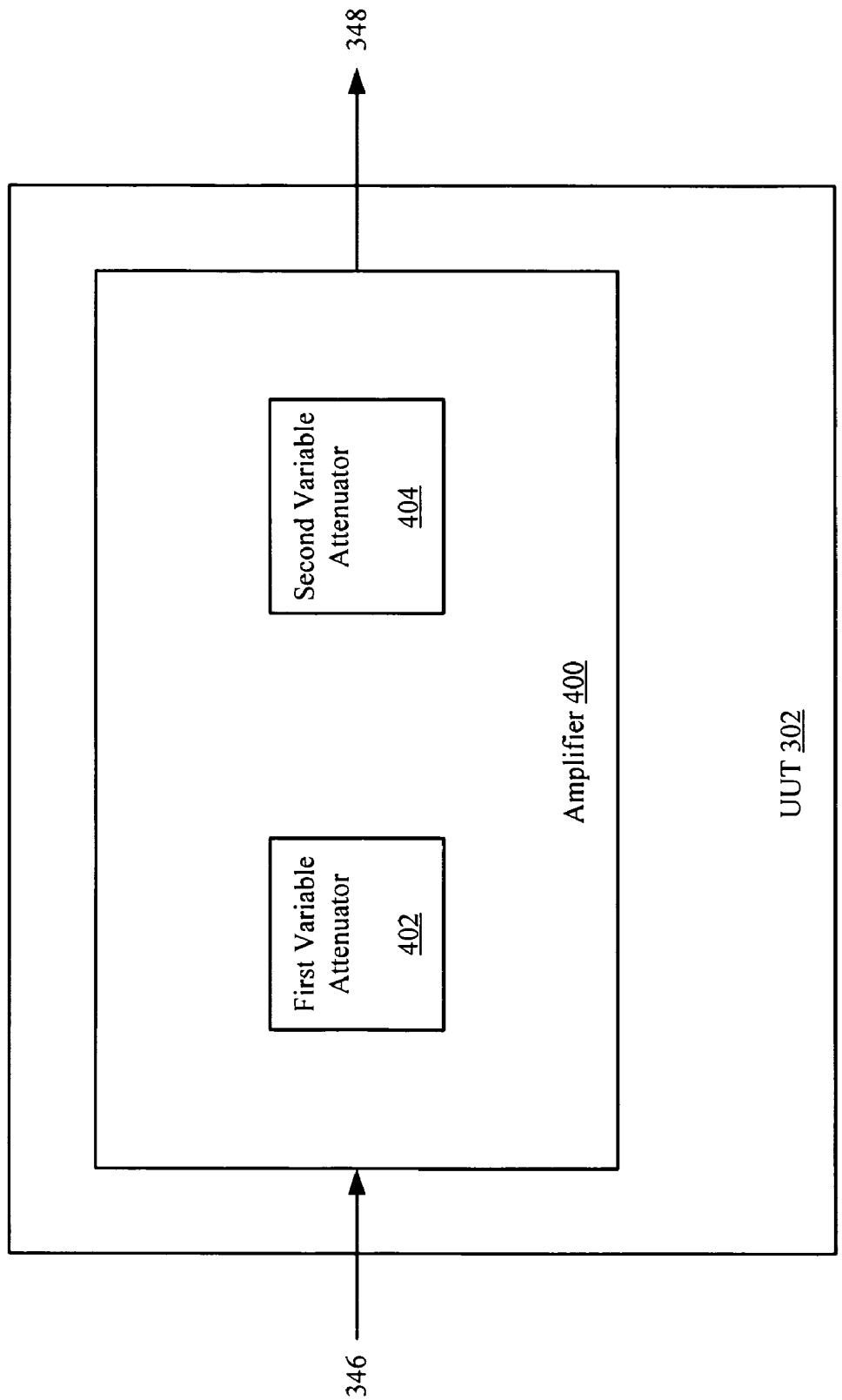
FIG. 4 shows a functional block diagram of the UUT shown in FIG. 3.

For example, the UUT 302 may include an amplifier 400 as shown in FIG. 4. The amplifier may include a set of variable attenuators that for simplicity are shown as a first variable attenuator 402 and second variable attenuator 404; however, it is appreciated that the set of variable attenuators may be more than only two variable attenuators. In this example, both the first variable attenuator 402 and second variable attenuator 404 may have their attenuations varied to change the amount of additive phase-noise produced in the amplifier output signal (i.e., UUT output signal 348). The first variable attenuator 402 functions to match the amplifier 400 to the input line carrying the amplifier input signal (i.e., UUT input signal 346), whereas the second variable attenuator 404 functions to match the amplifier 400 to the output line carrying the amplifier output signal (i.e., UUT output signal 348).

Referring back to FIG. 3 in this example, the controller 322 is capable of controlling the variable attenuators 402 and 404 as further described herein. As a result, the phase-noise measurement depends upon the control of the at least one controllable variable within UUT 302. For example, should UUT 302 include the amplifier 400, FIG. 4, within the UUT 302, the measured phase-noise will depend upon the settings of variable attenuators 402 and 404. Controller 322 may thus vary these settings (and hence the corresponding attenuation provided by variable attenuators 402 and 404) using the UUT command signal 370 and observe the resulting phase-noise in digital ADC output signal 360.

For example, if the phase-noise has increased when increased attenuation was commanded, the controller 322 may repeat the measurement but command a lesser amount of attenuation. It will be appreciated that the degrees of freedom and interaction of the variables controlled within UUT 302 will increase in complexity as the number of variables increases. However, the controller 322 may be configured to use techniques common to the radio industry to determine an optimum setting of these variables. Such methods of toggling controls for maximum efficiency and noise-floor may be automated because the controller 322 is able to detect and store optimized data sets. The "best fit" method or any signal processing method capable of "best data fit" determination may be utilized to determine an optimum setting for the controllable variables.

As discussed earlier, the phase-noise measured in the ADC output signal 360 depends upon the frequency of the UUT input signal 346. For example, the UUT 302 may be quite noisy at one frequency but less so at another. To measure phase-noise across a range of frequencies, controller 322 may command the variable low-noise source 310 to change the frequency of the UUT input signal 346 using the variable low-noise source command signal 368. The process of optimizing phase-noise responsive to variations of the controllable variables within the UUT 302 would then be repeated, the resulting phase-noise noted, the frequency altered again, and so on.

Figure 2:
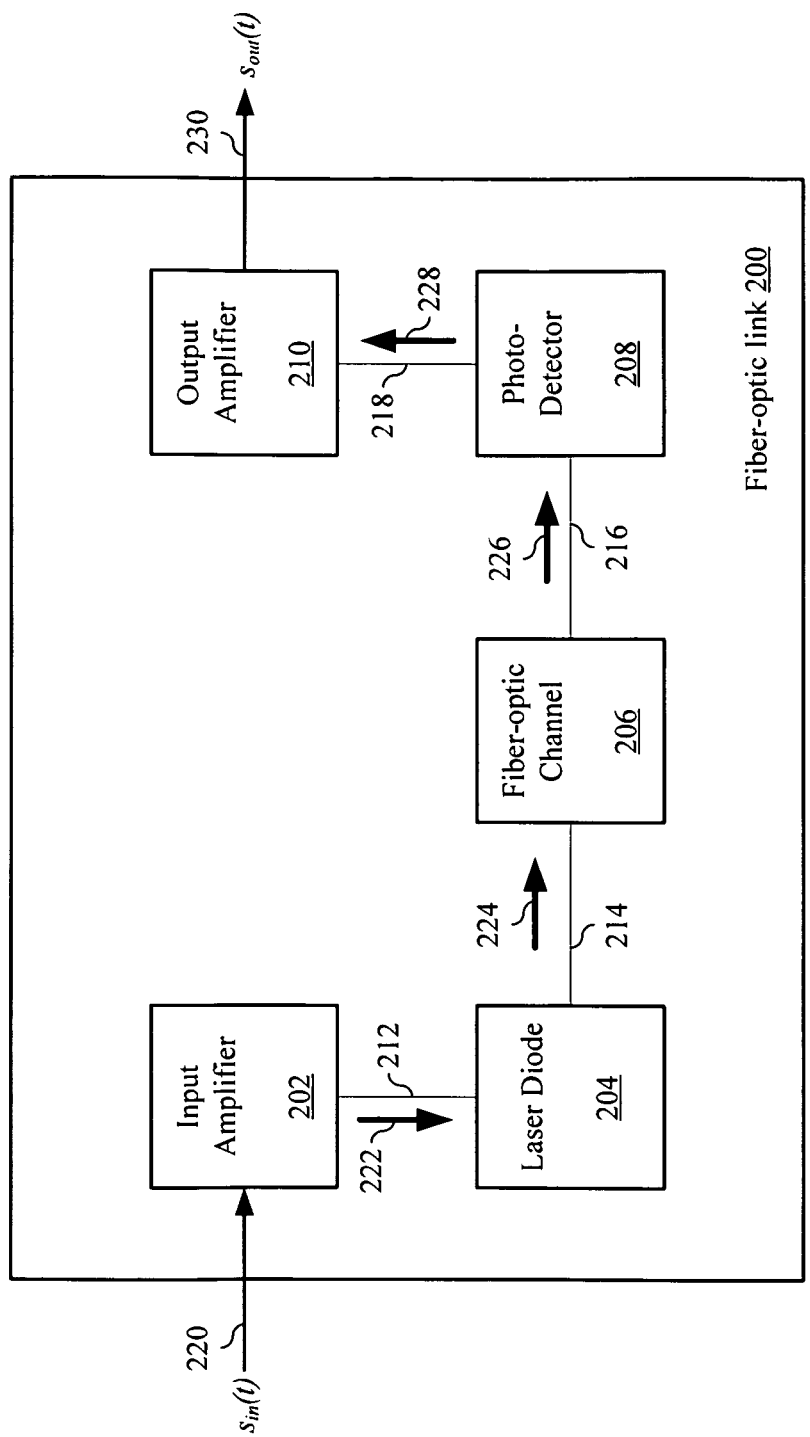
FIG. 2 shows a functional block diagram of a conventional fiber-optic link.

Generally, the amount and type of variables controllable by controller 322 within a UUT 302 is virtually endless. For example, should the UUT 302 include an fiber-optic link such as the known fiber-optic link 200 discussed in FIG. 2, the amplifiers 202 and 210 may be configured with attenuators as discussed with respect to FIG. 4 to provide four variables that include the amount of attenuation introduced by each attenuator. In addition (or alternatively), the biasing of the transistor (or transistors) within the amplifiers 202 and 210 may be made a controllable variable. Similarly, the biasing of the laser diode 204 and the photo-detector 208 may also be designed as controllable variables. Having determined the optimal settings of the controllable variables, a manufacturer may then manufacture systems or devices in which these variables are not controllable but configured as determined using the ANM System 300.

Combined UUT and Variable Low-Noise Source

Those of ordinary skill in the art will appreciate that the illustrated separation between the UUT 302 and the variable low-noise source 310 shown in FIG. 3 is a mere conceptual separation because the UUT and the variable low-noise source may be combined into one device (known as a "Source-UUT") such as, for example, an oscillator. In the example of an oscillator, the variable low-noise source is the UUT. As such, it would be redundant to drive this type of Source-UUT with a separate low-noise source and therefore there is no need for an externally produced UUT input signal to be sent to the UUT.

Figure 5:
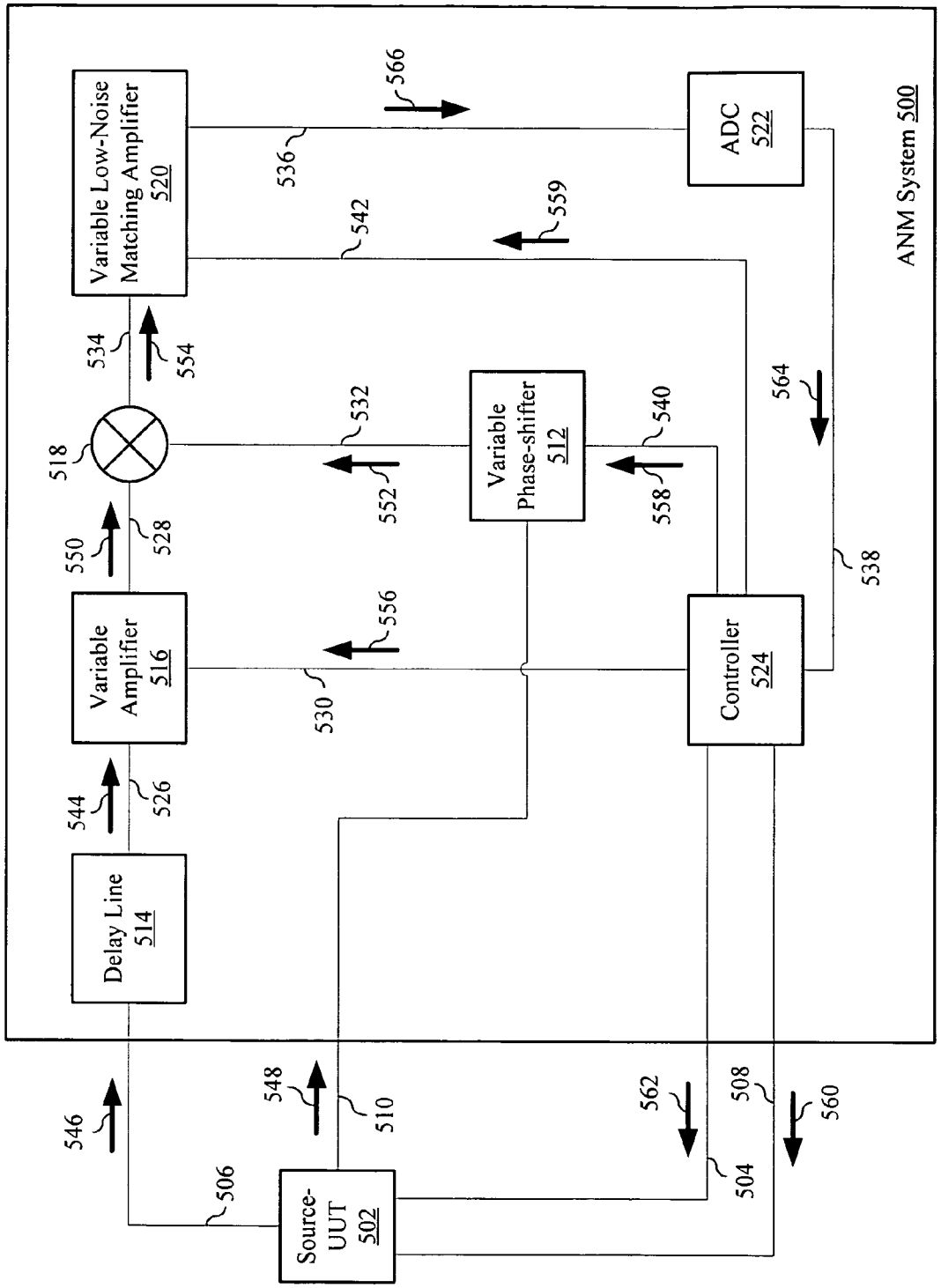
FIG. 5 shows a functional block diagram of an example of another implementation of ANM System in accordance with the invention.

Turning now to FIG. 5, a functional block diagram of example of another implementation of ANM System 500 is shown. In this example, the ANM System 500 is in signal communication with a Source-UUT 502 via signal paths 504, 506, 508, and 510.

The ANM System 500 may include a variable phase-shifter 512, delay line 514, variable amplifier 516, mixer 518, variable low-noise matching amplifier 520, ADC 522, and controller 524. In this example, the variable amplifier 516 may be in signal communication with the delay line 514, mixer 518, and controller 524 via signal paths 526, 528, and 530, respectively. The mixer 518 may be also in signal communication with the variable phase-shifter 512 and variable low-noise matching amplifier 520 via signal paths 532 and 534, respectively. The variable phase-shifter 512 is also in signal communication with the Source-UUT 502 via signal path 510. The ADC 522 is in signal communication with both the variable low-noise matching amplifier 520 and controller 524 via signal paths 536 and 538, respectively. The controller 524 is in signal communication with the Source-UUT 502, variable phase-shifter 512, variable amplifier 516, and variable low-noise matching amplifier 520, via signal paths 504, 508, 540, 530, and 542, respectively. Again, the controller 524 may be a controller device, microcontroller, processor, microprocessor, ASIC, DSP, or other similar programmable device.

In an example of operation to analyze the phase-noise of the Source-UUT 502, the delay line 514 is capable of producing a delayed output signal 544 of a Source-UUT output signal 546. The Source-UUT output signal 546 is produced by the Source-UUT 502. It is appreciated by those skilled in the art that in the situation where the Source-UUT 502 is a perfect source that is capable of producing a sinusoidal output signal equal to $\cos(\omega t)$, the phase difference between arbitrary times $t_1$ and $t_2$ depends solely upon the delay period between these times. However, in a real world source, there will also be some phase-noise that affects this phase difference. In general, it may be shown that the selection of the delay period affects the ability of ANM System 500 to measure phase-noise at smaller frequency offsets to the frequency of the carrier signal as well as the sensitivity of the phase-noise measurement. As the delay provided by delay line 514 is increased, the ability to measure phase-noise at smaller offsets from the carrier frequency is enhanced as well as the sensitivity. However, the delay cannot be arbitrarily increased because attenuation through the delay line 514 may become too severe and affect the measurement.

Inspection of FIGS. 3 and 5 illustrates the fundamental similarity between the characterization of a Source-UUT and a non-source UUT. Regardless of whether the UUT is a Source-UUT or non-source UUT, the control and operation of the variable amplifier 314 or 516, mixer 316 or 518, variable low-noise matching amplifier 318 or 520, ADC 320 or 522, and variable phase-shifter 312 or 512 is the same. Thus, similar to FIG. 3, the Source-UUT 502 provides a variable phase-shifter input signal 548 to phase variable phase-shifter 512 analogously as discussed with respect to the variable low-noise source 310 of FIG. 3. The variable amplifier 516 receives the delayed output signal 544 and produces a variable amplifier signal 550 that is passed to the mixer 518, which mixes the variable amplifier signal 550 with a variable phase-shifted signal 552 produced by the variable phase-shifter 512 (which is a 90 degree phase-shifted version of the variable phase-shifter input signal 548) to produce a mixer output signal 554. The controller 524 controls the variable amplifier 516 with a variable amplifier control signal 556 to maintain linear operation of mixer 518. The controller 524 additionally controls the variable phase-shifter 512 with a variable phase-shifter control signal 558 and the variable low-noise matching amplifier 520 with a variable low-noise matching amplifier control signal 559 via signal paths 540 and 542, respectively. The controller 524 operates to tune the at least one controllable variable within the Source-UUT 502 using a first UUT command signal 560, via signal path 508, analogously as discussed with respect to the tuning of non-source UUT 302 of FIG. 3. Similarly, the controller 524 controls the carrier frequency used by the Source-UUT 502 using a second UUT command signal 562, via signal path 504, as discussed with respect to FIG. 3. Again similar to the example in FIG. 3, the controller 524 controls the devices and/or modules in the ANM System 500 in response to monitoring a received ADC output signal 564, via signal path 538, produced by the ADC 522 in response to receiving a variable low-noise matching amplifier output signal 566 via signal path 536.

Figure 6:
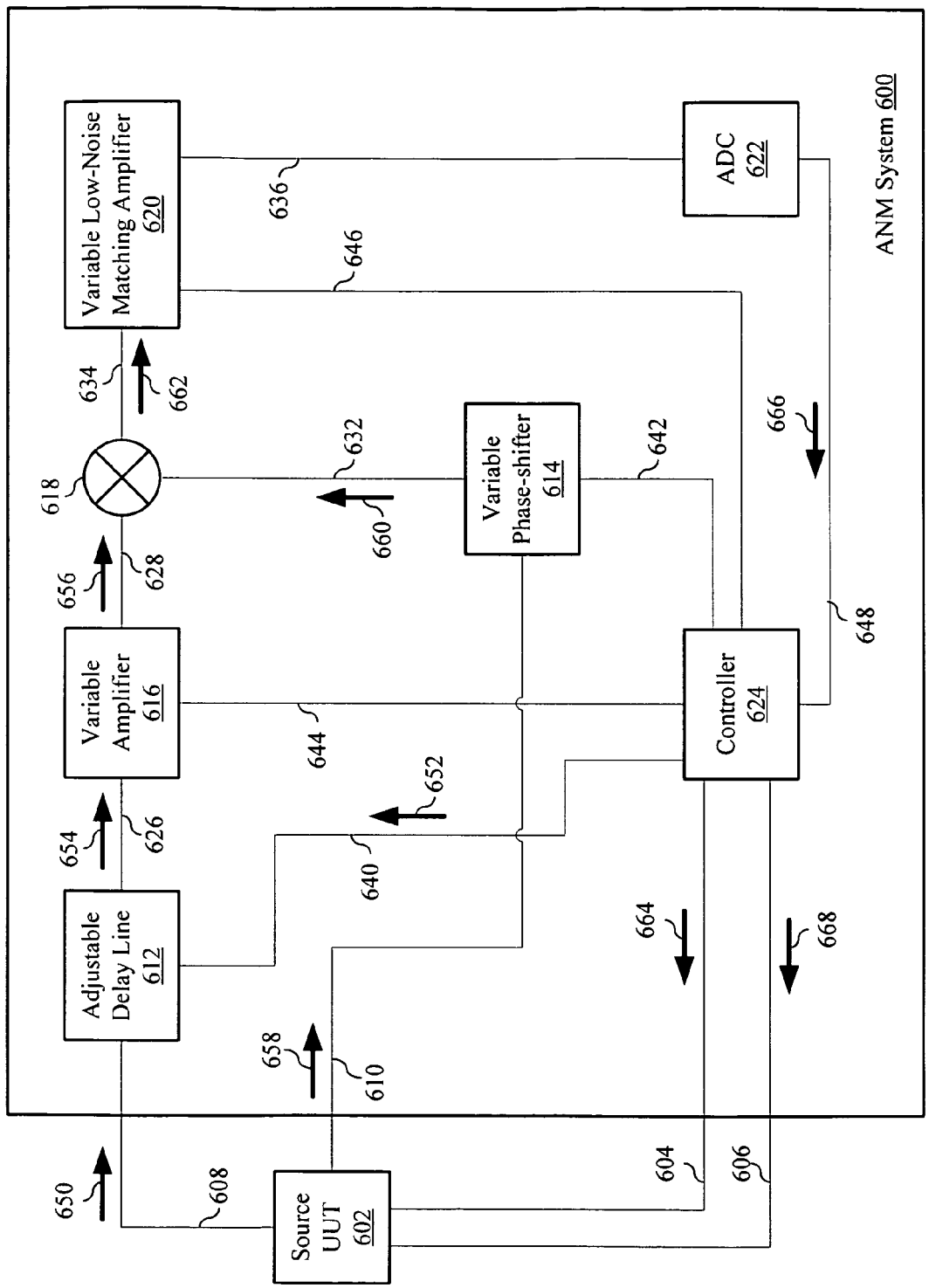
FIG. 6 shows a functional block diagram of an example of another implementation of an ANM System in accordance with the invention.

In FIG. 6, a functional block diagram of an example of another implementation of an ANM System 600 is shown in signal communication with a Source-UUT 602 via signal paths 604, 606, 608, and 610. Because the amount of delay provided by a delay line has a strong affect on the characterization of the phase-noise from a Source-UUT 602, the ANM System 600 (unlike the ANM System 500 shown in FIG. 5) includes a selectable delay feature shown as an adjustable delay line 612. However, similar to the ANM System 500 of FIG. 5, the ANM System 600 also may include a variable phase-shifter 614, variable amplifier 616, mixer 618, variable low-noise matching amplifier 620, ADC 622, and controller 624. In this example, the variable amplifier 616 may be in signal communication with the adjustable delay line 612, mixer 618, and controller 624 via signal paths 626, 628, and 644, respectively. The mixer 618 may be also in signal communication with the variable phase-shifter 614 and variable low-noise matching amplifier 620 via signal paths 632 and 634, respectively. The variable phase-shifter 614 is also in signal communication with the Source-UUT 602 via signal path 610. The ADC 622 is in signal communication with both the variable low-noise matching amplifier 620 and controller 624 via signal paths 636 and 638, respectively. The adjustable delay line 612 is also in signal communication with both the Source-UUT 602 and controller 624 via signal paths 608 and 640, respectively. The controller 624 is also in signal communication with the Source-UUT 602, variable phase-shifter 614, variable amplifier 616, variable low-noise matching amplifier 620, and ADC 622 via signal paths 604, 642, 644, 646, and 648, respectively. Again, the controller 624 may be a controller device, microcontroller, processor, microprocessor, ASIC, DSP, or other similar programmable device.

The operation of the ANM System 600 is similar to the operation of the ANM System 500 shown in FIG. 5 except for the difference related to the operation and control of a selectable delay feature versus the uncontrolled delay line 514 shown in FIG. 5. In FIG. 6, this selectable delay feature is provided by the adjustable delay line 612 that delays a Source-UUT output signal 650, received via signal path 608, that is produced by the Source-UUT 608. Depending upon the desired sensitivity and frequency offset of the phase-noise measurement, the controller 624 selects a delay line (not shown) within the adjustable delay line 612 using an adjustable delay line control signal 652 sent via signal path 640.

Figure 7:
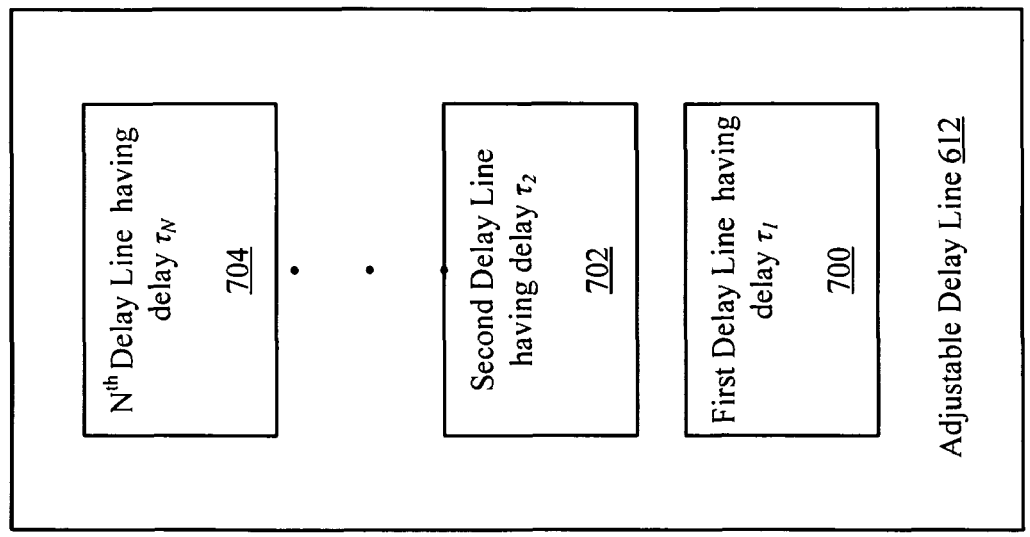
FIG. 7 shows a functional block diagram of an example of an implementation of the adjustable delay line shown in FIG. 6.

As example, the adjustable delay line 612 may include a plurality of delay lines that provide a corresponding plurality of delays, from delay $\tau_1$ to delay $\tau_N$ as shown in FIG. 7. For illustration clarity, only a first delay line 700 having delay $\tau_1$, second delay line 702 having delay $\tau_2$, and $N^{th}$ delay line 704 having delay $\tau_N$ are shown in FIG. 7 from the plurality of delay lines that are included within adjustable delay line 612. These delay lines 700, 702, and 704 may be selected by the controller 324, via adjustable delay line control signal 652, through activation of switches such as, for example, field effect transistors ("FETs") (not shown).

In an example of operation and turning back to FIG. 6, regardless of which delay line is selected within the adjustable delay line 612, the variable amplifier 616 then amplifies a received delayed output signal 654 from the adjustable delay line 612 (via signal path 626) and, in response, produces a variable amplifier output signal 656 that is passed to the mixer 618 analogous to the process discussed with respect to FIG. 5. Similarly, a variable phase-shifter input signal 658 is produced by the Source-UUT 602 and passed to the variable phase-shifter 614 via signal path 610. The variable phase-shifter 614 receives the variable phase-shifter input signal 658 and phase shifts it by 90 degrees to produce a variable phase-shifted signal 660 that is also received by mixer 618. In response, the mixer 618 mixes the variable amplifier output signal 656 with the variable phase-shifted signal 660 to produce a mixer output signal 662 that is passed to the variable low-noise matching amplifier 620 via signal path 634.

In this example, the Source-UUT 602 includes at least one controllable variable such as, for example, a transistor bias voltage or other variable controllable by a Source-UUT control signal 664 from the controller 624 sent via signal path 604. Thus, the ANM System 600 operates analogously to the discussion of operation of the ANM System 500 of FIG. 5. Responsive to measuring the phase-noise of the Source-UUT 602 utilizing a digital ADC output signal 666 (via signal path 648) produced by the ADC 622, the controller 624 drives a second Source-UUT control signal 668 (via signal path 606) to tune the at least one controllable variable within the Source-UUT 602 so as to optimize the phase-noise performance of the ANM System 600.

It is appreciated that although this invention has been described with respect to particular examples of implementation, this description is only an example of the invention's application and should not be taken as a limitation. As an example, in both FIGS. 5 and 6 the order of variable amplifier (514 or 612) and the delay line 514 or adjustable delay line 612 may be respectively reversed such that the delay line (or adjustable delay line) provides the delayed version of the variable amplifier output signal to the mixer (either 518 or 618).

Wireless Phase-Noise Measurement

As an example of another implementation, the ANM System is capable of measuring the noise performance of wireless transmitters through the reception and analysis of a transmitted wireless signal. In order to perform this implementation, a direct down-conversion technique described in U.S. Pat. No. 6,745,020 (which is titled "Direct Downconversion Receiver," and was filed on Aug. 29, 2002, which is herein incorporated by reference in its entirety) may be adapted to allow a user to remotely measure the noise-floor of a wireless transmitter.

Figure 8:
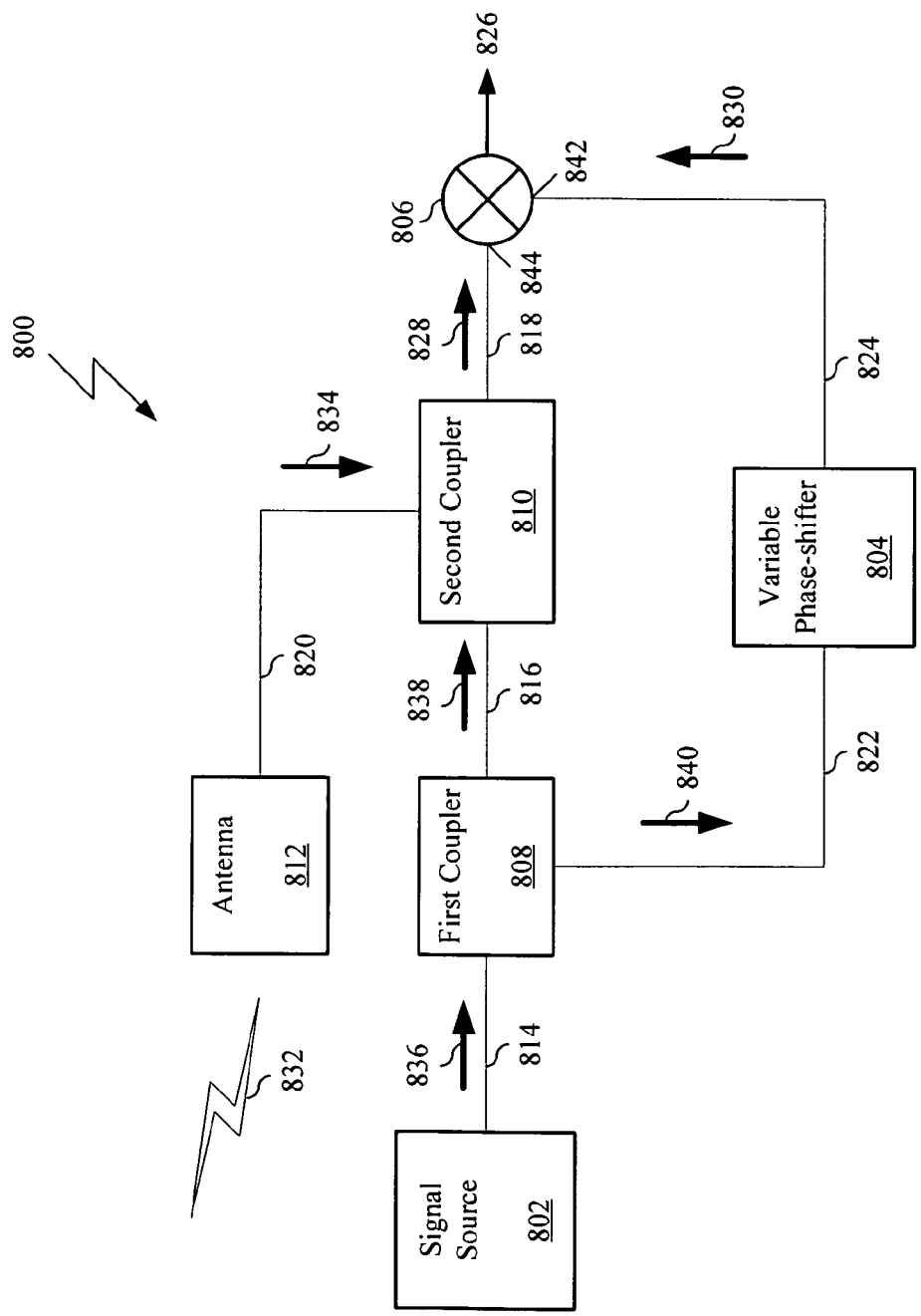
FIG. 8 shows a functional block diagram of an example of an implementation of a direct down-conversion receiver.

Turning to FIG. 8, a functional block diagram of an example of an implementation of a direct down-conversion receiver 800 (as disclosed in U.S. Pat. No. 6,745,020) is shown. The direct down-conversion receiver 800 may include a signal source 802, variable phase-shifter 804, mixer 806, first coupler 808, second coupler 810, and antenna 812. In this example, the first coupler 808 may be in signal communication with both the signal source 802 and second coupler 810 via signal paths 814 and 816, respectively. The second coupler 810 also may be in signal communication with both the mixer 806 and antenna 812 via signal paths 818 and 820, respectively. The variable phase-shifter 804 also may be in signal communication with the first coupler 808 and mixer 806 via signal paths 822 and 824, respectively.

The direct down-conversion receiver 800 is capable of mitigating a DC offset component in a baseband signal output 826 from the mixer 806. The mixer 810 may be either a double-sideband or single-sideband mixer whose baseband signal output 826 represents the product of a mixer input signal 828 (via signal path 818) to the mixer 806 and a frequency reference signal 830 (such as a local oscillator ("LO") signal) to the mixer 806 via signal path 824.

In an example of operation, the direct down-conversion receiver 800 receives an incoming radio frequency ("RF") signal 832 having a given carrier frequency at the antenna 812. In response, the antenna 812 produces a received RF signal 834 that is passed to the second coupler 810 via signal path 820. The second coupler 810 then couples the received RF signal 834 to the mixer input signal 828 and passes it to the mixer 806. It will be appreciated by those of ordinary skill in the art that the incoming RF signal 832 is received at the antenna 812 and may be processed by filters and low-noise amplifiers (not shown) before coupling to the mixer 806 as conventionally practiced in receiver architectures.

The signal source 802 may be a voltage controlled oscillator ("VCO") or another similar generator of a suitable LO signal output. As an example, the signal source 802 may produce a sinusoid output signal 836. Those of ordinary skill in the art will appreciate that the type of LO signal output will depend upon the particular modulation present in the incoming RF signal 832. Before passing the mixer input signal 828 to the mixer 306, a first coupler main output signal 838 and the received RF signal 834 are combined through the second coupler 810. The first coupler main output signal 838 is produced by passing the sinusoid output signal 836 through the first coupler 808. The first coupler 808 also produces a variable phase-shifter input signal 840 that is passed, via signal path 822, to the variable phase-shifter 804. It will be appreciated that a signal splitter also may be utilized in place of first coupler 808. The variable phase-shifter 804 is configured to phase-shift the sinusoid output signal 836 by 90 degrees to provide a quadrature local oscillator signal (i.e., the frequency reference signal 830) to a LO input port 842 of the mixer 806 (i.e., the port that receives the frequency reference signal 830 via signal path 824). Although the variable phase-shifter 804 is shown as a discrete component functional block in this example, it is appreciated that the variable phase-shifter 804 also may be included within the mixer 806. In the example of the variable phase-shifter 804 being part of the mixer 806, the opportunity for the frequency reference signal 830 to couple to an RF input port 844 of the mixer 806 (i.e., the port that receives the mixer input signal 828 via signal path 818) and thereby self mix and produce an undesirable DC offset component in baseband signal output 826 is minimized. Alternatively, the variable phase-shifter 804 may be located as close as possible to the LO input port 842 of the mixer 806 so as to minimize radiative or reactive coupling of the frequency reference signal 830 to the RF input port 844.

It is appreciated that the design of first and second couplers 808 and 810 depend upon the type of waveguides (such as, for example, stripline, coaxial cable, or microstrip type waveguides) chosen to propagate the received RF signal 834 and sinusoid output signal 836 utilizing RF techniques that are well known to those of skill in the art. In turn, the type of waveguides implemented depends upon the carrier frequency, signal power levels, space concerns, and other well-known design choices.

In this implementation the baseband signal output 826 includes a frequency offset term that is a sinusoid of the frequency difference between the RF frequency for the received RF signal 834 and the sinusoid output signal 836. In addition, a variety of double frequency terms are produced, which may be readily filtered away. In this fashion, a baseband signal output 826 may be achieved without the DC offset problem that exists with other direct down-conversion receivers.

Figure 9:
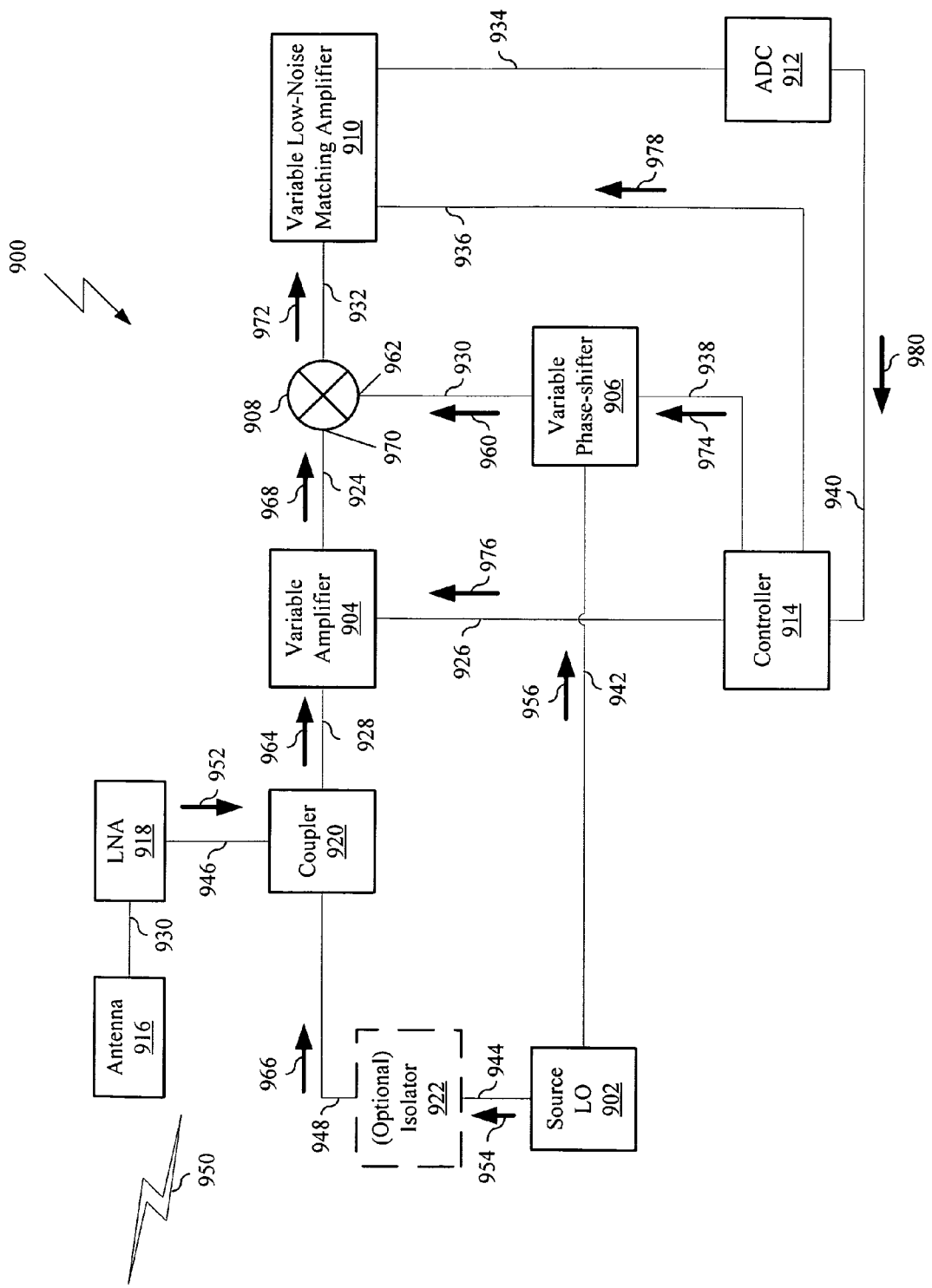
FIG. 9 shows a functional block diagram of an example of another implementation of an ANM System in accordance with the invention.

Turning to FIG. 9, an ANM System 900 is shown that includes an adaptation of the direct down-conversion receiver architecture discussed with regard to FIG. 8. The ANM System 900 may include source LO 902, variable amplifier 904, variable phase-shifter 906, mixer 908, variable low-noise matching amplifier 910, ADC 912, controller 914, antenna (or antennas) 916, low-noise amplifier ("LNA") 918, coupler 920, and optional isolator 922. The variable amplifier 904 may be in signal communication with the mixer 908, controller 914, and coupler 920 via signal paths 924, 926, and 928, respectively. The mixer 908 also may be in signal communication with the variable phase-shifter 906 and variable low-noise matching amplifier 910 via signal paths 930 and 932. The variable low-noise matching amplifier 910 may be in signal communication with the ADC 912 and controller 914 via signal paths 934 and 936, respectively. The controller 914 may be in signal communication with the variable phase-shifter 906 and ADC 912 via signal paths 938 and 940, respectively. The source LO 902 may be in signal communication with the variable phase-shifter 906 and optional isolator 922 via signal paths 942 and 944, respectively. The coupler 920 may be in signal communication with the LNA 918 and optional isolator 922 via signal paths 946 and 948, respectively. The LNA 918 also may be in signal communication with the antenna 916 via signal path 930.

In an example of operation, a wireless signal 950 is received at the antenna 916 (or antennas) and processed through the LNA 918 to produce an RF received signal 952. In this example, the source LO 902 is configured analogously as discussed with regard to FIG. 5. The source LO 902 produces two identical signals that are referred to as a source LO output signal 954 and a variable phase-shifter input signal 956. However, in this example, the source LO output signal 954 or the variable phase-shifter input signal 956 act as an LO to the received RF signal 952. As such, the variable phase-shifter input signal 956 is phase-shifted through variable phase-shifter 906 to produce a quadrature LO signal (i.e, variable phase-shifted output signal 960) that is received at a LO port 962 of a mixer 908 via signal path 930. The received RF signal 952 is combined with source LO output signal 954 using the coupler 920 to form a combined coupler output signal 964. In this example, the source LO output signal 954 may be processed by the optional isolator 922 to form an isolation processed source LO output signal 966. If no optional isolator 922 is utilized, the isolation processed source LO output signal 966 is the same as the source LO output signal 954.

As discussed analogously with regard to FIG. 5, the variable amplifier 904 may amplify the combined coupler output signal 964 such that a resulting variable amplified output signal 968 applied to an RF port 970 of the mixer 908 is of sufficient power when compared to that applied to LO port 962 such that the mixer 908 operates linearly. In this regard, depending upon the design and linearity of the mixer 908, the variable amplifier 904 may not be necessary in some implementations. The mixer output signal 972 from the mixer 908, on signal path 932, may then be processed as discussed earlier with regard to FIG. 5. In this implementation, the controller 914 controls the variable phase-shifter 906, variable amplifier 904, and variable low-noise matching amplifier 910 as discussed previously using control signals 974 via signal path 938, 976 via signal path 926, and 978 via signal path 936, respectively. In order to prevent the received RF signal 952 from polluting the quadrature LO signal (i.e., source LO output signal 954), source LO 902 may be isolated from coupler 920 using the optional isolator 922. However, if coupler 920 is sufficiently directional, the optional isolator 922 may not be necessary. By performing a spectral analysis, such as an FFT, on the digitized noise signal 980 produced by the ADC 912 on signal path 940, the controller 914 may characterize the noise-floor of a wireless transmitter (not shown) that produced the wireless signal 950. In this example, the noise measurement is made entirely wirelessly without requiring any transmission line connecting the ANM System 900 to the wireless transmitter.

In another implementation, a delay line (not shown) may also be used as discussed analogously with regard to FIG. 5. This delay line may be inserted before or after coupler 920. However, it will be appreciated that a quadrature discriminator function with regard to the received RF signal 952 is not achieved through inclusion of such a delay line in that the resulting discrimination function will be applied to the source LO output signal 954 and the variable phase-shifter input signal 956 instead of the received RF signal 952. However, there may be implementations in which it is advantageous to perform a discrimination function with regard to the source LO 902. In any case, the source LO 902 should possess a lower noise-floor than the wireless transmitter (not shown) utilized to transmit the wireless signal 916 so that an additive noise measurement may be performed. An example low-noise source that may be configured as source LO 902 is described in U.S. patent application Ser. No. 11/494,884, filed Jul. 21, 2006, the contents of which are herein incorporated by reference in their entirety. However, it will be appreciated that any suitable low-noise source may be used to form source LO 902. An initial calibration may be performed to determine the noise-floor of the source LO 902 so that the additive noise resulting from the combination with received RF signal 952 may be determined. Because a down-conversion architecture is created instead of a quadrature discriminator with regard to received RF signal 952, the wireless signal 950 will be represented as a frequency difference (offset from the LO) in the mixer output signal 972. Between this signal and DC will be the transmitter noise spectrum. Double frequency components may be removed using an appropriate signal filter (not shown) as discussed with regard to FIG. 8. Unlike the discriminator discussed in FIG. 5, this spectrum of digitized noise signal 980 will represent both amplitude-noise and phase-noise.

Figure 10:
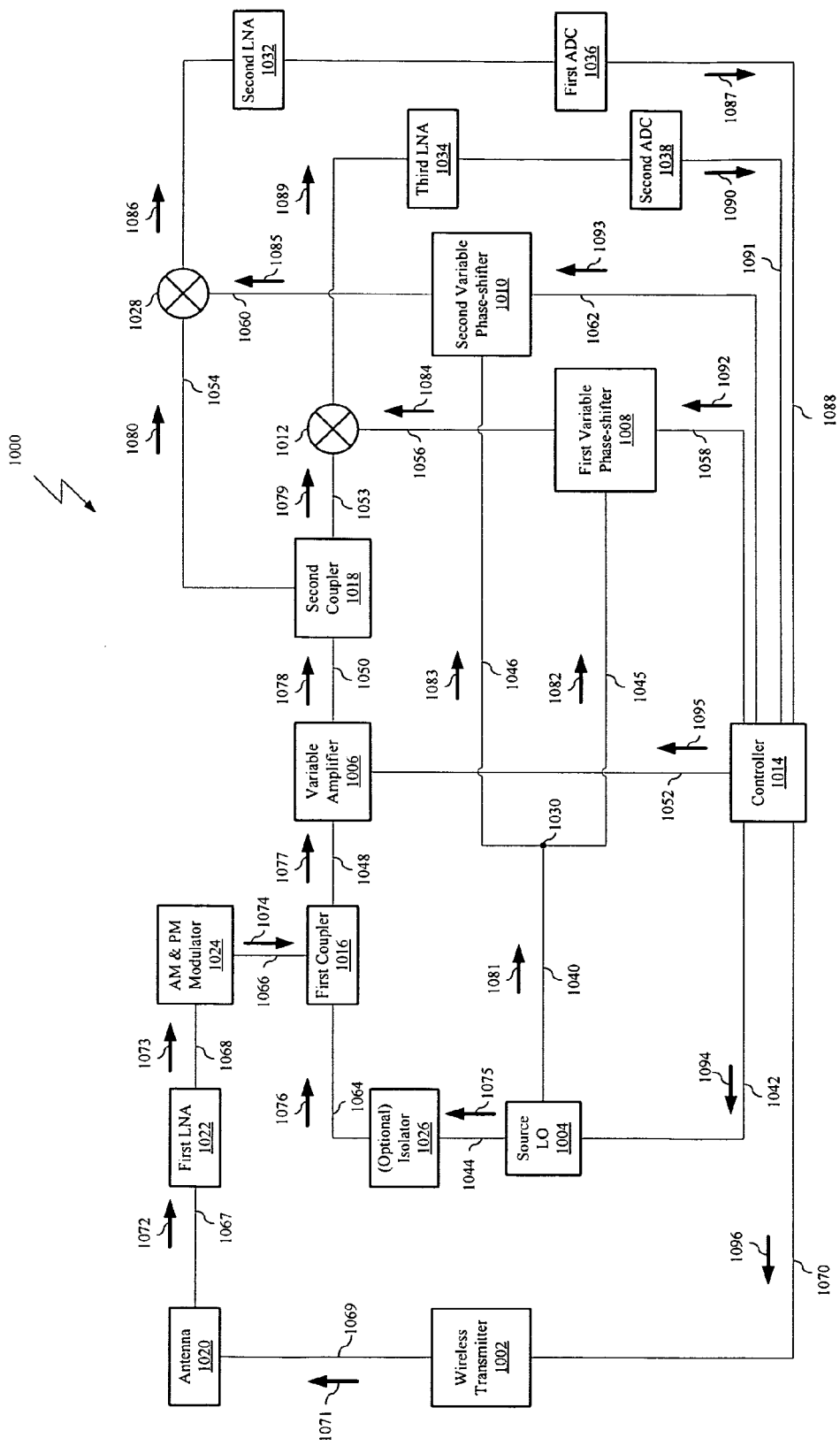
FIG. 10 shows a functional block diagram of an example of another implementation of an ANM System in accordance with the invention.

As a result, in FIG. 10 a functional block diagram of an example of an implementation of an ANM System 1000 is shown that is capable of measuring the amplitude-noise and phase-noise of a wireless transmitter 1002 separately. The ANM System 1000 may include source LO 1004, variable amplifier 1006, first variable phase-shifter 1008, second variable phase-shifter 1010, first mixer 1012, controller 1014, first coupler 1016, second coupler 1018, antenna 1020, first LNA 1022, amplitude and phase ("AM & PM") modulator 1024, optional isolator 1026, second mixer 1028, splitter 1030, second LNA 1032, third LNA 1034, first ADC 1036, and second ADC 1038. The source LO 1004 may be in signal communication with the first variable phase-shifter 1008, second variable phase-shifter 1010, controller 1014, and optional isolator 1026 via signal paths 1040, 1042, and 1044, respectively. The splitter 1030 is a signal splitter capable of splitting any signal produced by the source LO 1004 (and sent via signal path 1040) into two split signals that are sent to the first variable phase-shifter 1008 and second variable phase shifter 1010 via signal paths 1045 and 1046, respectively. The variable amplifier 1006 may be in signal communication with the first coupler 1016, second coupler 1018, and controller 1014 via signal paths 1048, 1050, and 1052, respectively. The second coupler 1018 may be in signal communication with the first mixer 1012 and second mixer 1028 via signal paths 1053 and 1054, respectively. The first variable phase-shifter 1008 may be in signal communication with both the first mixer 1012 and controller 1014 via signal paths 1056 and 1058, respectively. Similarly, the second variable phase-shifter 1010 may be in signal communication with both the second mixer 1028 and controller 1014 via signal paths 1060 and 1062, respectively. The first coupler 1016 may be in signal communication with the optional isolator 1026 and AM & PM modulator 1024 via signal paths 1064 and 1066, respectively. The first LNA 1022 may be in signal communication with the antenna 1020 and the AM & PM modulator 1024 via signal paths 1067 and 1068, respectively. The wireless transmitter 1002 may be in signal communication with the antenna 1020 via signal path 1069, which in this example is a wireless signal path. Additionally, the controller 1014 may be in signal communication with the transmitter 1002 via signal path 1070, which may also be a wireless signal path.

In an example of operation, the wireless transmitter 1002 transmits a wireless signal 1071 to the antenna 1020 (or antennas) which receives the wireless signal 1071 and produces a received signal 1072 that is passed to the LNA 1022 via signal path 1067. The LNA 1022 processes the received signal 1072 to produce a received RF signal 1073 that is sent to the AM & PM modulator 1024 via signal path 1068. The AM & PM modulator 1024 receives the received RF signal 1073 and applies AM modulation and/or phase PM techniques to the received RF signal 1073 to produce a modulated received signal 1074, which is passed to the first coupler 1016 via signal path 1066.

The source LO 1004 produces a source LO output signal 1075 that is passed through the optional isolator 1026 to the first coupler 1016 via signal paths 1044 and 1064. If the optional isolator 1026 is present, the optional isolator 1026 produces an isolated source LO output signal 1076. If the optional isolator 1026 is not present, the isolated source LO output signal 1076 would be the same as the source LO output signal 1075. Again as described in FIG. 9, the purpose of the optional isolator 1026 is to prevent the modulated received signal 1074 from polluting the source LO output signal 1075, thus the optional isolator 1026 isolates the source LO 1004 from the first coupler 1016. However, if the first coupler 1016 is sufficiently directional, the optional isolator 1026 may not be necessary.

The first coupler 1016 combines the isolated source LO output signal 1076 (or source LO output signal 1075 if the optional isolator 1026 is not present) with the modulated received signal 1074 to produce a combined received signal 1077 that is passed to the variable amplifier 1006 via signal path 1048. The variable amplifier 1006 receives the combined received signal 1077 amplifies it to produce an amplifier received signal 1078 that is passed to the second coupler 1018 via signal path 1050. The second coupler 1018 splits the amplified received signal 1078 into a first amplified received signal 1079 that is passed (via signal path 1053) to first mixer 1012 and a second amplified received signal 1080 that is passed (via signal path 1054) to second mixer 1028.

The source LO 1004 also produces a variable phase-shifter input signal 1081 that is sent via signal path 1040 to the splitter 1030 (or other suitable device capable of splitting the signal into two signals). The splitter 1030 receives the variable phase-shifter input signal 1081 and splits it to produce a first variable phase-shifter input signal 1082 and second variable phase-shifter input signal 1083 along signal paths 1045 and 1046, respectively. The first variable phase-shifter input signal 1082 is processed in the first variable phase-shifter 1008 to provide a quadrature LO signal 1084 to the first mixer 1012 in a similar fashion as discussed with regard to FIG. 9. In addition, the second variable phase-shifter input signal 1083 is processed in the second variable phase-shifter 1010 to provide an in-phase LO signal 1085 to the second mixer 1028. As described above, both mixers (1012 and 1028) receive a split version of the amplified received signal 1078.

Because second mixer 1028 is mixing the in-phase signal LO 1085 with the second amplified received signal 1080, the resulting second mixer output signal 1086 represents the in-phase ("I") component after processing this second mixer output signal 1086 through the second LNA 1032 and first ADC 1036 as discussed analogously with regard to FIG. 9. This resulting I component signal 1087 may be passed to the controller 1014 via signal path 1088. Similarly, first mixer 1012 is mixing the quadrature LO signal 1084 with the first amplified received signal 1079, which produces a first mixer output signal 1089. The first mixer output signal 1089, once processed by the third LNA 1034 and second ADC 1038, represents a digital quadrature ("Q") component signal 1090 that is passed to the controller 1014 via signal path 1091.

In this implementation, the determination of whether the amplitude-noise or phase-noise is being measured with these I and Q components signals 1087 and 1090 is controlled by the type of modulation being utilized on the received RF signal 1073 in the AM & PM modulator 1024. As an example, if the AM & PM modulator 1024 applies a predetermined AM modulation and then a predetermined PM modulation to the received RF signal 1073, the ANM System 1000 may analyze the effects of these modulations on the I and Q component signals 1090 and 1087 to determine the amount of additive amplitude-noise and additive phase-noise in the wireless transmitter 1002.

In addition to determining the noise-floor in the wireless transmitter 1002, the ANM System 1000 is capable of also tuning the wireless transmitter 1002 using the techniques described in U.S. patent application Ser. No. 11/134,546. As an example, wireless transmitter 1002 may have a bias setting of a transistor (not shown) or other suitable tunable device that may be controlled by controller 1014 using a wireless transmitter control signal 1091 via signal path 1070. By observing the effect on the noise-spectrum through analysis of the I and Q components signals 1090 and 1087 (or their combined effect as discussed with regard to FIG. 9), the controller 1014 may adjust the wireless transmitter control signal 1091 (which may be designated as a control variable ("CV")) such that the wireless transmitter 1002 is tuned to lower the noise-floor of the wireless transmitter 1002. The controller 1014 controls the first variable phase-shifter 1008 (via the first variable phase-shifter control signal 1092 via signal path 1058, where the first variable phase-shifter control signal 1092 is also another CV) to maintain its output in quadrature and the second variable phase-shifter 1010 (via second variable phase-shifter control signal 1093 via signal path 1062, where the second variable phase-shifter control signal 1093 is also another CV) to maintain its output in-phase with the source LO output signal 1075 by analyzing the digitized noise signal (or signals) and adjusting the corresponding control variables ("CVs") accordingly.

As an example, the first variable phase-shifter 1008 is controlled by the first variable phase-shifter control signal 1092 so as to be in quadrature with the amplified signal 1078 (which is basically a related version of source LO output signal 1075) from variable low-noise amplifier 1006. If, however, the carrier signal is not eliminated due to an error in the first variable phase-shifter control signal 1092, the carrier signal will be present as a DC offset in the resulting noise-spectrum. This DC offset will change sign as the first variable phase-shifter 1008 scans through almost quadrature angles (for example, from 80 to 100 degrees) such that it has one polarity on one side of the quadrature and an opposite polarity on the other side of quadrature. The effect of a CV on a measurable variable ("MV") such as the DC offset may be used in a variety of control algorithms. For example, the change of sign in the DC offset may be used in a zero-crossing search. In general, a CV that produces a zero-crossing MV may have its range divided into a number of intervals. The controller 1014 steps the CV through these intervals and observes the effect on the zero-crossing MV. For example, the zero-crossing MV may change sign with regard to two values $MV_0$ and $MV_1$ that correspond to values for the CV of $CV_0$ and $CV_1$, respectively. Given this straddling of the zero-crossing point, it may be shown that an optimal setting for the CV ("$CV_{optimal}$") is:

$$CV_{optimal} = \frac{CV_0 \times MV_1 - CV_1 \times MV_0}{MV_1 - MV_0} \qquad \text{equation (1)}$$

In general, a $CV_{optimal}$, such as the first variable phase-shifter control signal 1092 will change with time due to temperature changes and other effects. This change with respect to time may be tracked using a convergence algorithm. For example, the straddling interval (corresponding to $CV_1$ and $CV_0$) may be reduced by a convergence factor such as two. A new value for $CV_{optimal}$ is then calculated using, for example, equation (1). The difference between successive measurements may then be averaged with previously-obtained differences to provide a time-varying-corrective factor. A calculated $CV_{optimal}$ may then be adjusted according to the time-varying-corrective factor. Prior to updating the CV, a measurement of the MV with regard to a tolerance factor may be performed.

The second variable phase-shifter 1010 is controlled in a complementary fashion in that the output signal of the second mixer 1028 should have a maximum carrier power. A second variable phase-shifter control signal 1093 (which is also another CV) controlling the second variable phase-shifter 1010 may be controlled by the controller 1014 to find a maximum value in the corresponding MV. For example, the output signal of the second mixer 1028 may be incremented across its range such that for five successive increments of the CV ranges from a value of $CV_0$ to $CV_4$, the corresponding values of the MV is produced such that $MV_2 > MV_1 > MV_0$ and also $MV_2 > MV_3 > MV_4$. The value of the CV that produces the maximum MV would thus be $CV_2$. If no maximum is found across the available range for the CV, the intervals between successive CVs may be too broad such that a new search is performed with the interval spacing reduced by ½. Once the maximum is found, the interval between $CV_0$ and $CV_4$ is sampled at twice the previous rate such that the interval between successive CV points is one-half what was used in the previous search. If the maximum pattern is no longer discernable, it may be presumed that the algorithm has zoomed into the noise at the maximum of the MV variable. The maximum in the MV for the last iteration of the CV in which the pattern is discernable provides the corresponding $CV_{optimal}$ value. This $CV_{optimal}$ value may be tracked as discussed with regard to the zero-crossing MV control.

Additional control would be provided to source LO 1004 (if it is desirable to change the frequency), via control signal 1094 along signal path 1042, variable amplifier 1006 (via control signal 1095 along signal path 1052), and to other components such as the LNAs 1032 and 1034 (which may be variable LNAs). Empirical observations in the ANM System 1000 may show that a single CV may have a dominant effect relative to the other CVs. For example, first variable phase-shifter control signal 1092 may be the dominant CV for the zero-crossing point in the first mixer output signal 1089. Thus, in this example, the dominant CV may be tuned first, followed by the less dominant CVs. However, it will be appreciated that this tuning methodology may be readily extended to the control of multiple CVs in parallel.

Figure 11:
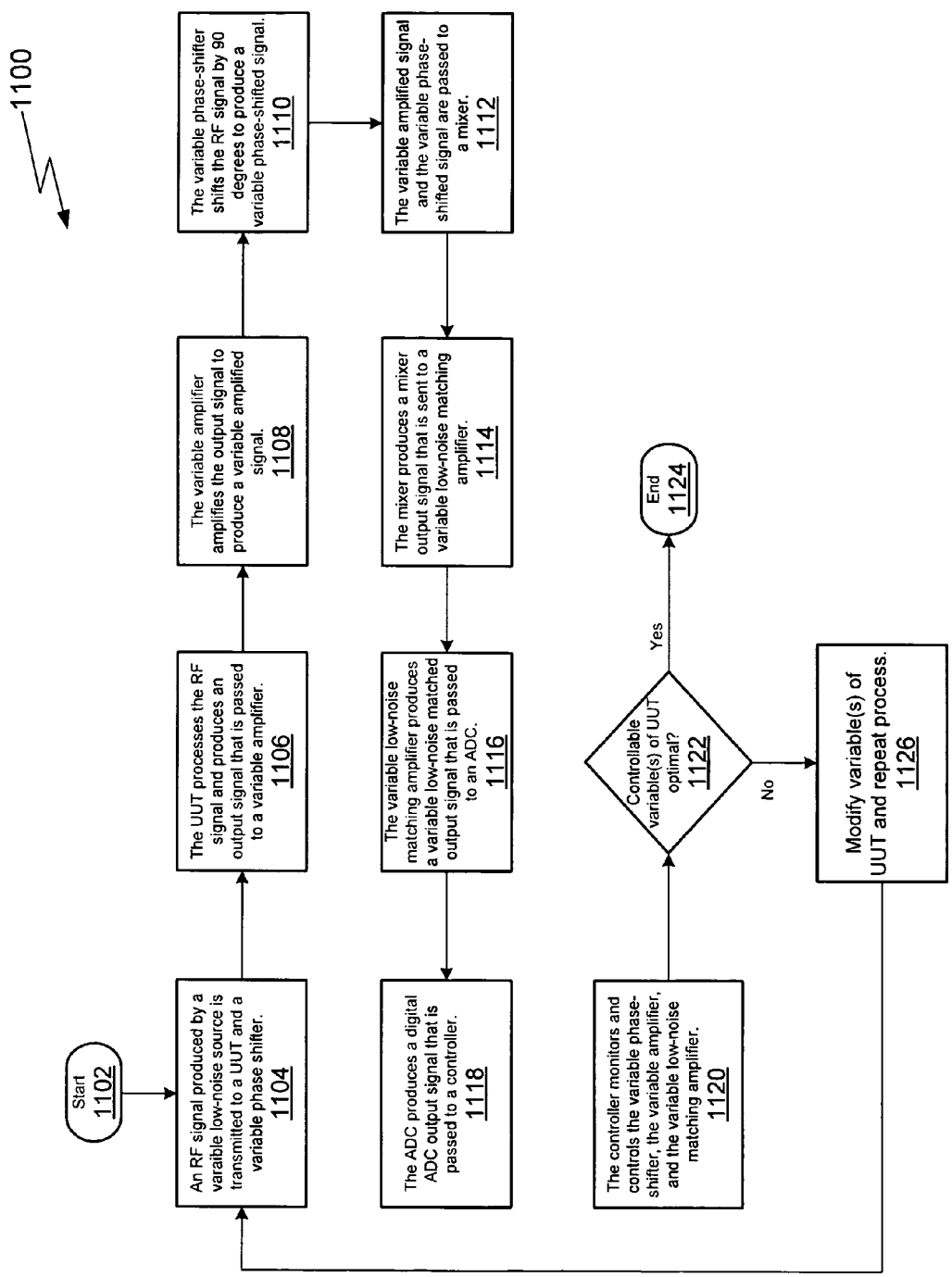
FIG. 11 shows a flowchart illustrating an example of a method of operation of an ANM System in accordance with the invention.

Turning to FIG. 11, a flowchart illustrating an example of a method of operation of an ANM System that utilizes feedback to tune one or more controllable variables in a unit-under-test ("UUT") is shown. The example process 1100 starts at step 1102 and in step 1104, a variable low-noise source produces and transmits an RF signal to the UUT and to a variable phase-shifter. In step 1106, the UUT receives the RF signal and processes it to produce an output signal, which is then passed to a variable amplifier where, in step 1108, the variable amplifier amplifies the output signal to produce a variable amplified signal. In step 1110, the variable phase-shifter receives the RF signal where the variable phase-shifter phase shifts the RF signal by 90 degrees to produce a variable phase-shifted signal.

The variable amplified signal and the variable phase-shifted signal are then passed to a mixer in step 1112. In step 1114, the mixer produces a mixer output signal that is sent to a variable low-noise matching amplifier, and in step 1116, the variable low-noise matching amplifier produces a variable low-noise matched output signal that is passed to an analog-to-digital converter ("ADC"). The ADC then produces a digital ADC output signal that is passed to a controller in step 1118. In step 1120, the controller monitors the digital ADC output signal and controls the variable phase-shifter, the variable amplifier, and the variable low-noise matching amplifier utilizing a variable phase-shifter control signal, a variable amplifier control signal, and a variable low-noise matching amplifier control signal, respectively, and commands the variable low-noise source to change the frequency of the UUT input signal utilizing a variable low-noise source command signal.

Additionally the controller is configured to control the values of at least one controllable variable of the UUT utilizing a UUT command signal. As described above with respect to FIG. 4, an example of such controllable variables may be variable attenuators included in the UUT. In decision step 1122, the controller determines if an optimal setting of the at least one controllable variable has been obtained, e.g., there is minimum phase-noise. If the optimal settings have been obtained, the process 1100 ends at step 1124. Otherwise, the process returns to step 1104 and repeats itself.

It will be understood, and is appreciated by persons skilled in the art, that one or more functions, modules, units, blocks, processes, sub-processes, or process steps described above may be performed by hardware and/or software. If the process is performed by software, the software may reside in software memory (not shown) in any of the devices described above. The software in software memory may include an ordered listing of executable instructions for implementing logical functions (i.e., "logic" that may be implemented either in digital form such as digital circuitry or source code or in analog form such as analog circuitry or an analog source such an analog electrical, sound or video signal), and may selectively be embodied in any computer-readable (or signal-bearing) medium for use by or in connection with an instruction execution system, apparatus, or device, such as a computer-based system, processor-containing system, or other system that may selectively fetch the instructions from the instruction execution system, apparatus, or device and execute the instructions. In the context of this document, a "computer-readable medium" and/or "signal-bearing medium" is any means that may contain, store, communicate, propagate, or transport the program for use by or in connection with the instruction execution system, apparatus, or device. The computer readable medium may selectively be, for example but not limited to, an electronic, magnetic, optical, electromagnetic, infrared, or semiconductor system, apparatus, device, or propagation medium. More specific examples, but nonetheless a non-exhaustive list, of computer-readable media would include the following: an electrical connection (electronic) having one or more wires, a portable computer diskette (magnetic), a RAM (electronic), a read-only memory "ROM" (electronic), an erasable programmable read-only memory (EPROM or Flash memory) (electronic), an optical fiber (optical), and a portable compact disc read-only memory "CDROM" (optical). Note that the computer-readable medium may even be paper or another suitable medium upon which the program is printed, as the program can be electronically captured, via for instance optical scanning of the paper or other medium, then compiled, interpreted or otherwise processed in a suitable manner if necessary, and then stored in a computer memory.

While various embodiments of the invention have been described, it will be apparent to those of ordinary skill in the art that many more embodiments and implementations are possible within the scope of this invention. Accordingly, the invention is not to be restricted except in light of the attached claims and their equivalents.

What is claimed is:

1. A noise test measurement system configured to measure a noise component of a transmitted RF signal, comprising:
   an antenna for receiving the transmitted RF signal to provide a received RF signal;
   a low-noise amplifier configured to amplify the received RF signal to provide an amplified RF signal;
   a local oscillator configured to provide an LO signal;
   a first coupler configured to combine a first version of the LO signal with the amplified RF signal to provide a combined RF signal;
   a first variable phase-shifter configured to phase-shift a second version of the LO signal into a quadrature LO signal responsive to a control signal;
   a first mixer having an RF port configured to receive the combined RF signal and an LO port configured to receive the quadrature LO signal, the first mixer being further configured to mix the signals received at its RF and LO ports to provide a first mixed output signal; and
   a processor configured to analyze a digitized version of the first mixed output signal so as to produce the control signal and to measure the noise component.

2. The system of claim 1, further comprising an analog-to-digital converter for providing the digitized version.

3. The system of claim 2, further comprising a second variable amplifier configured to variably amplify the mixer output to provide a signal to the analog-to-digital converter.

4. The system of claim 3, wherein the processor is further configured to control the second variable amplifier to maintain its output within a desired dynamic range of the analog-to-digital converter.

5. The system of claim 1, further comprising:
   a second variable phase-shifter configured to phase-shift a third version of the LO signal to provide an in-phase LO signal responsive to a second control signal; and
   a second mixer having an RF port configured to receive the combined RF signal and an LO port configured to receive the quadrature LO signal, the second mixer being further configured to mix the signals received at its RF and LO ports to provide a second mixed output signal, wherein the processor is further configured to analyze a digitized version of the second mixed output signal to produce the second control signal and to measure the noise component.

6. The system of claim 5, wherein the processor is configured to determine an amplitude noise measurement and a phase noise measurement from the noise component.

7. The system of claim 1, wherein a wireless transmitter that provides the transmitted RF signal includes a tunable variable, and wherein the processor is configured to tune the tunable variable so as to lower the measured noise component.

8. The system of claim 7, wherein the tunable variable is a bias setting of a transistor.

9. A method of measuring a noise floor for a wireless transmitter, comprising:
   transmitting an RF signal from the wireless transmitter to provide a transmitted RF signal;
   receiving the transmitted RF signal to provide a received RF signal;
   combining the received RF signal with a version of an LO signal to provide a combined RF signal;
   mixing the combined RF signal with a quadrature version of the LO signal to provide a mixer output signal; and
   analyzing a spectrum of the mixer output signal to determine the noise floor.

10. The method of claim 9, further comprising the step of adjusting a power of the combined RF signal to ensure that the mixing is linear.

11. The method of claim 9, wherein analyzing the spectrum includes:
    digitizing the mixer output signal to form a digitized signal; and
    fast Fourier transforming the digitized signal.

12. The method of claim 11, further comprising the step of controlling the phase-shifting based upon the spectral analysis.

* * * * *